(12) United States Patent
Fong et al.

(10) Patent No.: US 9,328,529 B2
(45) Date of Patent: May 3, 2016

(54) ELECTRICAL DEVICE MOUNTING POLE

(71) Applicant: Thomas & Betts International, Inc., Wilmington, DE (US)

(72) Inventors: Robert Fong, Bethlehem, PA (US); Daniel L. Gardner, Stewartsville, NJ (US); Geoffrey Reed, Olmsted Township, OH (US); Philip DiParisi, Flemington, NJ (US)

(73) Assignee: Thomas & Betts International, LLC, Wilmington, DE (US)

( * ) Notice: Subject to any disclaimer, the term of this patent is extended or adjusted under 35 U.S.C. 154(b) by 296 days.

(21) Appl. No.: 14/161,916

(22) Filed: Jan. 23, 2014

(65) Prior Publication Data
US 2014/0247542 A1 Sep. 4, 2014

Related U.S. Application Data

(60) Provisional application No. 61/771,985, filed on Mar. 4, 2013.

(51) Int. Cl.
*H05K 7/00* (2006.01)
*F16M 11/28* (2006.01)
(Continued)

(52) U.S. Cl.
CPC .................. *E04H 12/08* (2013.01); *H05K 7/00* (2013.01); *H02B 5/02* (2013.01); *Y10T 29/49117* (2015.01)

(58) Field of Classification Search
CPC ........... H05K 7/00; H05K 7/14; F16M 11/28; F16M 11/26; F16M 2200/00; F16M 2200/025; E04H 12/08; E04H 12/003; Y10T 29/49117; H02B 5/02; H02B 1/50; H02G 3/128; H02G 3/125

USPC ......... 174/58, 50, 496, 503, 535, 542, 54, 61, 174/57, 68.3; 220/3.2, 3.3, 4.02; 248/906, 248/59, 65, 70, 121, 122.1, 127, 132, 161; 211/26; 361/679.01, 600, 601, 679.05
See application file for complete search history.

(56) References Cited

U.S. PATENT DOCUMENTS 4,751,610 A * 6/1988 Nickola ................... H02B 1/50
174/38
4,790,505 A 12/1988 Rose et al.
(Continued)

FOREIGN PATENT DOCUMENTS

CA 2353841 A1 6/2000
CA 2424599 A1 10/2004
(Continued)

*Primary Examiner* — Angel R Estrada
(74) *Attorney, Agent, or Firm* — Snyder, Clark, Lesch & Chung, LLP

(57) ABSTRACT

A mounting pole for high voltage equipment can be adjusted at particular increments to provide for installations at various heights. A base section includes a right-side flange, a left-side flange, and a center web formed substantially in the shape of an I-beam with a front channel. The center web includes a first set of adjustment holes. The base section also includes a control mounting bracket to receive hardware for securing a control unit for a high voltage switch. A channel assembly is slideably contained within the front channel. The channel assembly includes a second set of adjustment holes, and a set of mounting holes to receive hardware for securing the high voltage switch. The base section and the channel assembly are configured so that the first and second set of adjustment holes can be selectively aligned during field operations to set the mounting pole at one of multiple height increments.

20 Claims, 7 Drawing Sheets

(51) Int. Cl.
*E04H 12/08* (2006.01)
*H02B 5/02* (2006.01)

(56) References Cited

U.S. PATENT DOCUMENTS

| | | | | |
|---|---|---|---|---|
| 4,812,958 A * | 3/1989 | Rolfe | ............... | H02G 3/0493 |
| | | | | 174/493 |
| 5,098,046 A * | 3/1992 | Webb | ............... | H02G 3/128 |
| | | | | 248/906 |
| 5,186,337 A | 2/1993 | Foster et al. | | |
| 5,284,255 A | 2/1994 | Foster et al. | | |
| 5,400,212 A * | 3/1995 | Hanson | ............... | H02B 1/50 |
| | | | | 174/38 |
| 5,657,884 A * | 8/1997 | Zilincar, III | ............... | A47F 5/0068 |
| | | | | 211/103 |
| 5,661,263 A * | 8/1997 | Salvaggio | ............... | H02G 3/0462 |
| | | | | 174/68.3 |
| 5,820,255 A * | 10/1998 | Carrington | ............... | E04H 12/003 |
| | | | | 174/493 |
| 6,765,186 B2 | 7/2004 | Janesick | | |
| 6,803,521 B2 * | 10/2004 | Vrame | ............... | H02G 3/123 |
| | | | | 174/57 |
| 7,059,572 B2 | 6/2006 | Ware et al. | | |
| 7,085,128 B2 * | 8/2006 | Wilfong | ............... | H02B 1/50 |
| | | | | 174/38 |
| 7,271,336 B2 * | 9/2007 | Dinh | ............... | H02G 3/125 |
| | | | | 174/57 |
| 7,394,020 B2 | 7/2008 | Gerardo | | |
| 7,592,542 B1 | 9/2009 | Gerardo | | |

FOREIGN PATENT DOCUMENTS

| | | |
|---|---|---|
| CA | 2590486 A1 | 11/2007 |
| CA | 2538723 C | 7/2010 |

\* cited by examiner

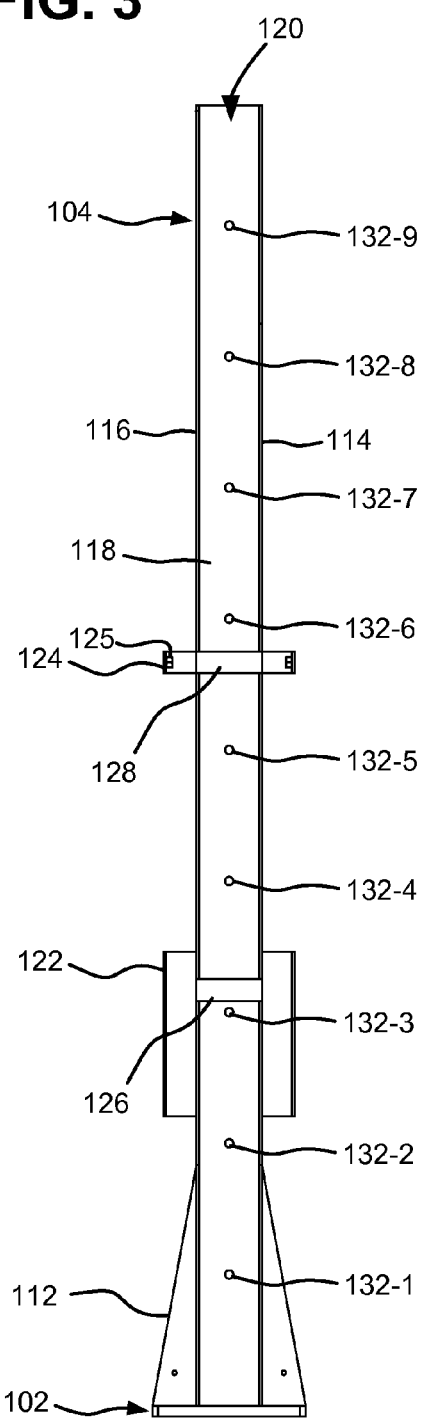
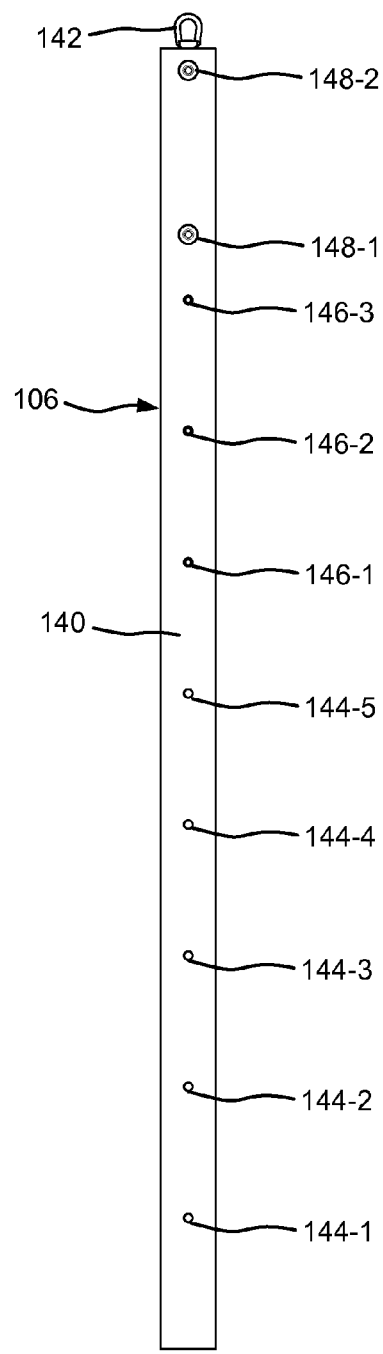

ELECTRICAL DEVICE MOUNTING POLE

CROSS-REFERENCE TO RELATED APPLICATION

This application claims priority under 35 U.S.C. §119, based on U.S. Provisional Patent Application No. 61/771,985 filed Mar. 4, 2013, the disclosure of which is hereby incorporated by reference herein.

BACKGROUND OF THE INVENTION

The present invention relates to the field of high voltage electrical switching equipment. Installation of high voltage switching equipment, such as sub-station switches, typically uses fixed-length poles (e.g., secured on a concrete pad) to mount the equipment above the ground.

BRIEF DESCRIPTION OF THE DRAWINGS

FIG. 3 is a front view of a base section of the mounting pole of FIG. 2;

FIG. 4 is a front view of a channel assembly of the mounting pole of FIG. 2;

DETAILED DESCRIPTION OF THE PREFERRED EMBODIMENTS

The following detailed description refers to the accompanying drawings. The same reference numbers in different drawings may identify the same or similar elements.

Systems and/or methods described herein are related to mounting of high voltage equipment. A mounting pole may be adjusted at particular increments (e.g., 12-inch increments) to provide for installations at various heights. The mounting pole also includes mounts for associated electrical switch enclosures, such as a power module and/or control unit. The systems and methods described herein can eliminate the need to inventory standard mounting poles of various heights.

In one implementation, a mounting pole for high voltage equipment may include a base section secured to a mounting plate and a channel assembly. The base section may include a right-side flange, a left-side flange, and a center web formed substantially in the shape of an I-beam with a front channel. The center web may include a first set of adjustment holes. The base section may also include multiple retaining brackets that span across the front channel from a front edge of the right-side flange to a front edge of the left-side flange, and a control mounting bracket secured to at least one of the right-side flange or the left-side flange to receive hardware for securing a control unit for a high voltage switch. The channel assembly may be slideably contained within the front channel. The channel assembly may include a second set of adjustment holes, and a set of mounting holes, positioned above the second set of adjustment holes, to receive hardware for securing the high voltage switch. The base section and the channel assembly are configured so that at least some of the first set of adjustment holes and some the second set of adjustment holes may be selectively aligned during field operations to set the mounting pole at one of multiple height increments.

Figure 1:
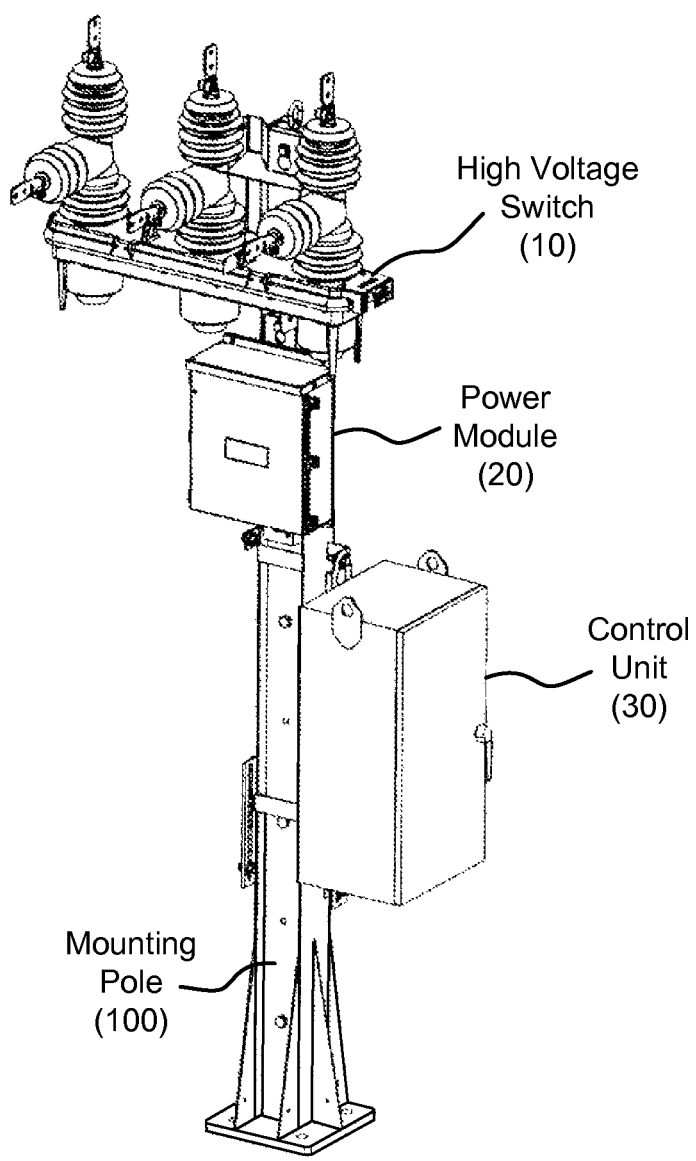
FIG. 1 is a diagram of an exemplary environment in which systems and methods described herein may be implemented.

FIG. 1 provides a diagram of an exemplary environment in which systems and/or methods described herein may be implemented. High voltage equipment may include a high voltage switch 10, a power module 20, and a control unit 30. High voltage switch 10 may include, for example, a recloser, which may generally be viewed as a circuit breaker equipped with a mechanism that can automatically close the circuit breaker after the breaker has been opened due to a fault. High voltage switch 10 may be used, for example, on overhead power distribution systems. Since many short-circuits on overhead lines clear themselves (e.g., after a tree branch or animal that caused the short circuit falls away from the lines), high voltage switch 10 can improve service continuity by automatically restoring power to a line after a momentary fault. High voltage switch 10 may weigh several hundred pounds.

According to an implementation described herein, high voltage switch 10 may be mounted, along with power module 20 and control unit 30, on an adjustable mounting pole 100. In various installations, control unit 30 may be positioned near the bottom of mounting pole 100 (e.g., accessible to a technician standing on/near the ground). However, high voltage switch 10 and power module 20 may need to be positioned at any one of a variety of installation heights (e.g., nominally between 10 to 16 feet to the top of mounting pole 100) for different environments.

Figure 2:
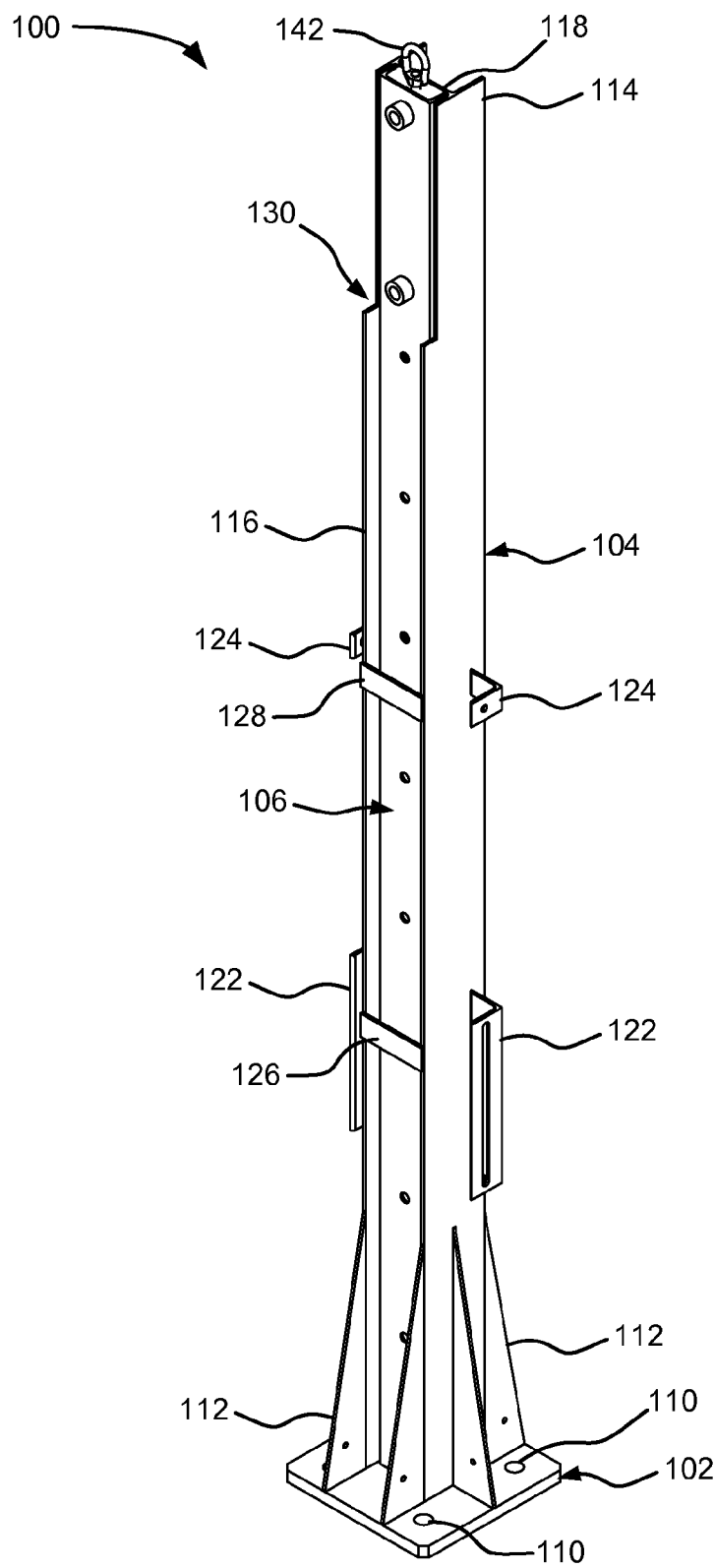
FIG. 2 is an isometric view of an adjustable mounting pole in a fully-retracted configuration according to an implementation described herein.
Figure 5:
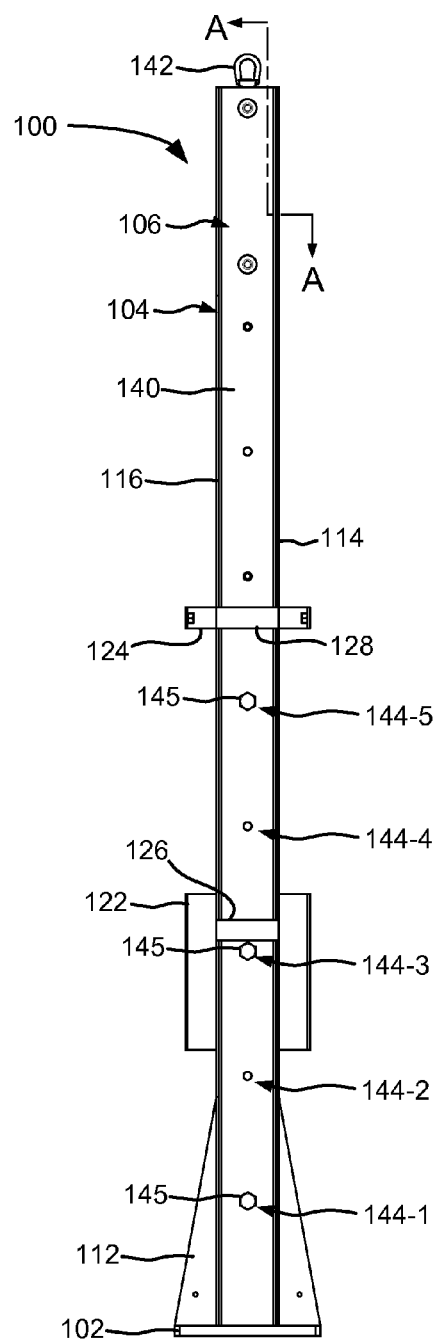
FIG. 5 is a front view of the mounting pole of FIG. 2, shown with fasteners installed.
Figure 6:
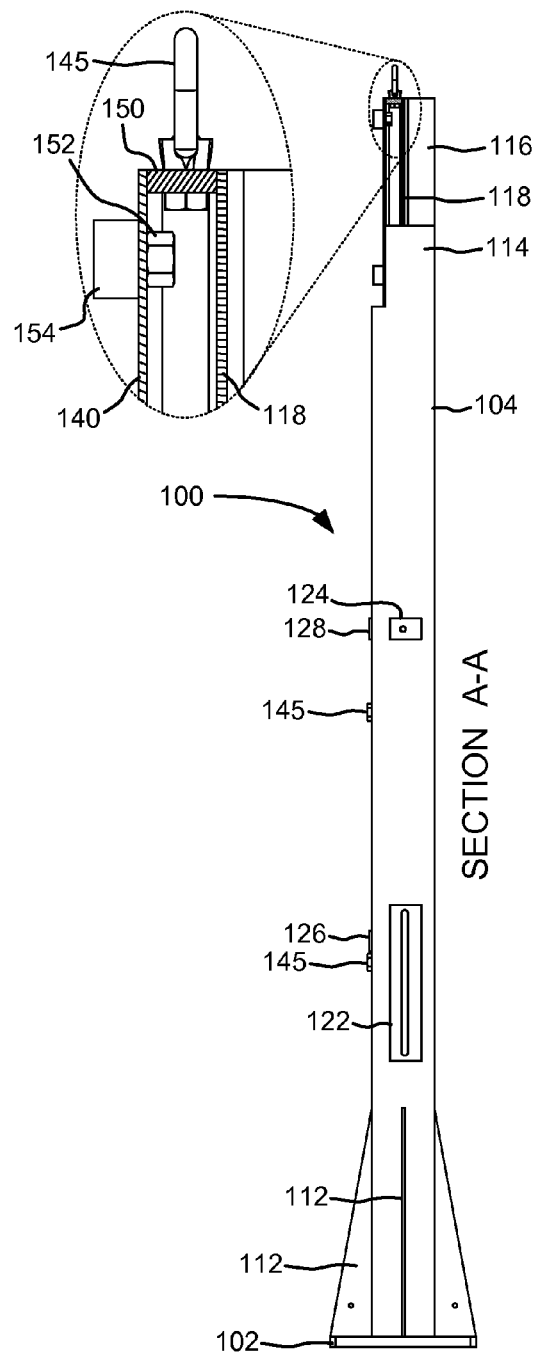
FIG. 6 is a side view of the mounting pole of FIG. 5 with a cross section along section A-A of FIG. 5.
Figure 7:
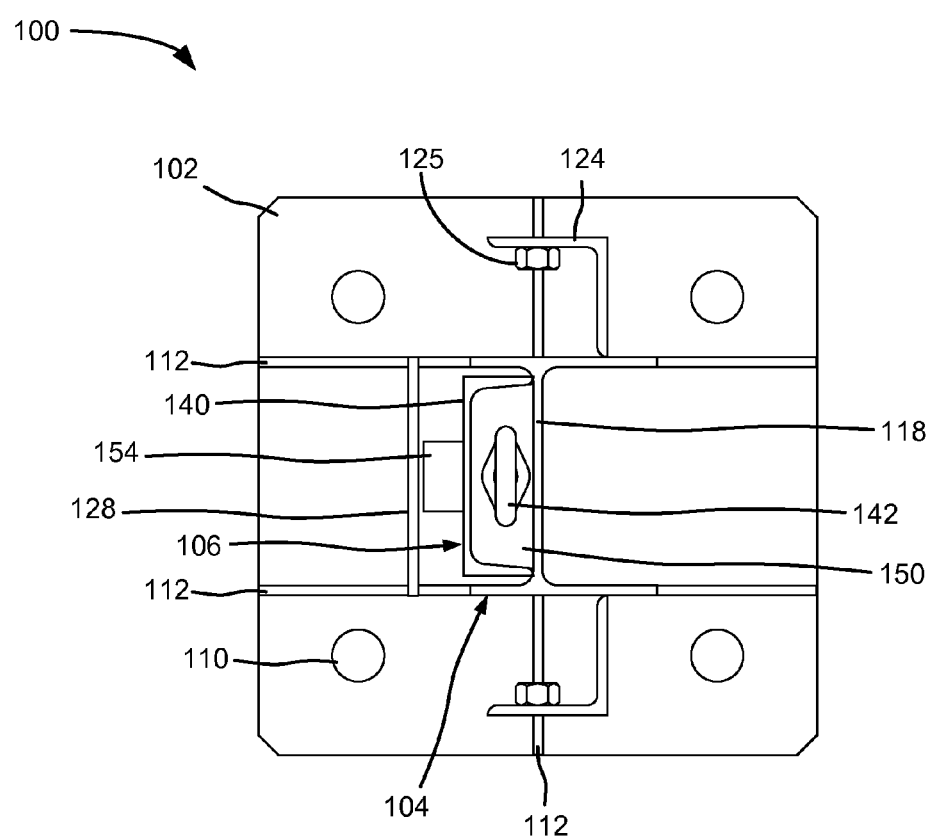
FIG. 7 is a top view of the mounting pole of FIG. 2.
Figure 8:
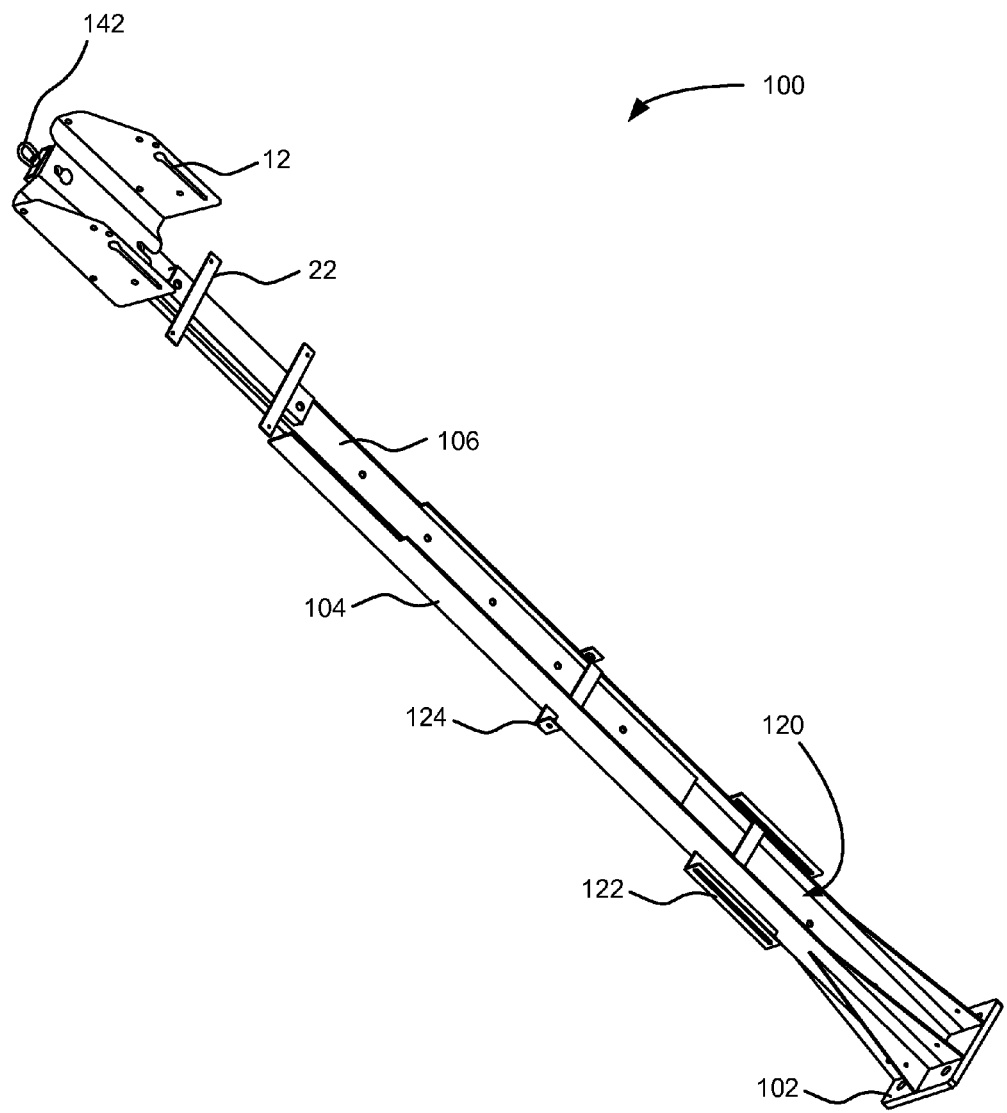
FIG. 8 is a perspective view of the mounting pole of FIG. 2, with the channel assembly in a partially extended position and additional mounting brackets installed.

FIGS. 2-8 provide multiple views of mounting pole 100 and its components. FIG. 2 provides an isometric view of mounting pole 100 in a fully-retracted configuration. FIG. 3 provides a front view of a base section 104 of mounting pole 100, and FIG. 4 provides a front view of a channel assembly 106 of mounting pole 100. FIG. 5 provides a front view of mounting pole 100, shown with fasteners installed, and FIG. 6 provides a side view of mounting pole 100 with a cross section along section A-A of FIG. 5. FIG. 7 is a top view of mounting pole 100. FIG. 8 is a perspective view of the mounting pole 100, shown with channel assembly 106 in a partially extended configuration and additional mounting brackets installed.

Referring collectively to FIGS. 2-8, mounting pole 100 may include a mounting plate 102, a base section 104, and a channel assembly 106. Each of mounting plate 102, base section 104, and channel assembly 106 may be made from a strong, rigid, corrosion-resistant material. For example, mounting plate 102, base section 104, and channel assembly 106 may be formed from galvanized structural steels, such as steel conforming to ASTM A572, A992, or A500 standards. As described further herein, hardware (e.g., bolts, nuts, washers, etc.) used with mounting pole 100 may also include strong corrosion-resistant materials, such as bolts conforming to ASTM A325X standards.

Mounting plate 102, base section 104, and channel section 106 may generally be sized to support weights of high voltage switch 10, power module 20, and control unit 30 at any incremental height of mounting pole 100 while meeting design codes requirements for welds, wind, seismic, and/or short circuit forces. In one implementation, mounting plate 102 may be a three-quarter-inch thick square with 14-inch sides to support a 10-foot long base section 104 and a 10-foot long channel assembly 106.

Mounting plate 102 may include mounting holes 110 to receive a set of bolts or other hardware (not shown). The bolts may be inserted through mounting holes 110 and used to secure mounting plate 102 to, for example, a concrete platform.

Base section 104 may be secured (e.g., welded) to mounting plate 102. Base section 104 may be additionally supported on mounting plate 102 by a set of support extensions (or flanges) 112. Extensions 112 may each be formed generally in the shape of a right triangle. Extensions 112 may be secured (e.g., welded) along two sides to a top surface of mounting plate 102 and to a portion of base section 104, respectively.

Base section 104 may include a right-side flange 114, a left-side flange 116, and a center web 118 formed generally in the shape of an I-beam. Right-side flange 114, left-side flange 116, and center web 118 together form a front channel 120 (shown in FIGS. 3 and 8) in which channel assembly 106 may be retained in a vertically adjustable manner.

Each of right-side flange 114 and left-side flange 116 may include a lower control mounting bracket 122 and an upper control mounting bracket 124. Lower control mounting brackets 122 and upper control mounting brackets 124 may each include apertures to receive hardware (e.g., bolts, washers, etc) for securing a control unit (e.g., control unit 30) on either the right side or left side of base section 104. In one implementation, as best shown in FIGS. 3 and 7, upper control mounting brackets 124 may include a nut 125 that is welded to the bracket and aligned with the aperture to receive mounting hardware. Lower control mounting brackets 122 and upper control mounting brackets 124 may generally be positioned vertically on base section 104 to mount control unit 30 at a height that is accessible to a technician standing on the ground.

Base section 104 may also include a lower retaining bracket 126 and an upper retaining bracket 128. Lower retaining bracket 126 and upper retaining bracket 128 may be welded to front edges of right-side flange 114 and left-side flange 116 to prevent channel assembly 106 from falling forward out of front channel 120 (e.g., during a height adjustment).

Base section 104 may also include a notch 130 to accommodate a particular shape of a mounting bracket 12 (FIG. 8) for high voltage switch 10. Notch 130 may include a cutout on each of flange 114 and flange 116 that extends to the top of base section 104. In other implementations (e.g., depending on the design of mounting bracket 12 for a particular high voltage switch 10), notch 130 may positioned higher/lower on base section 104 or omitted.

As shown in FIG. 3, web 118 may include a multiple adjustment holes 132-1 through 132-9 (referred to herein collectively as "adjustment holes 132" and generically as "adjustment hole 132"). In one implementation, adjustment holes 132 may be spaced vertically at particular intervals (e.g., 12-inch intervals).

Channel assembly 106 may include a bar 140, shown in FIG. 4, configured to slide vertically within front channel 120. As shown in FIG. 7, for example, bar 140 generally has a C-shaped horizontal cross section. In other implementations, bar 140 may be a hollow bar or a solid bar. Channel assembly 106 may also include a lifting eye 142 exposed at a top end of bar 140.

As shown in FIG. 4, for example, bar 140 may include multiple front-facing adjustment holes 144-1 through 144-5 (referred to herein collectively as "adjustment holes 144" and generically as "adjustment hole 144"), power module mounting holes 146-1 through 146-3 (referred to herein collectively as "power module mounting holes 146" and generically as "power module mounting hole 146"), and switch mounting holes 148-1 and 148-2 (referred to herein collectively as "switch mounting holes 148" and generically as "switch mounting hole 148").

Adjustment holes 144 may be spaced vertically at particular intervals (e.g., 12-inch intervals) to match the intervals of adjustment holes 132. Adjustment holes 132 of base section 104 may be aligned with adjustment holes 144 of channel assembly 106 in different orientations to provide different heights for mounting pole 100. Fasteners 145 (such as bolts with lock washers, washers, and nuts) may be inserted through selected adjustment holes 132 and adjustment holes 144 to secure channel assembly 106 in different positions relative to base section 104, as shown in FIGS. 5 and 6. In one implementation, three sets fasteners 145 may be used in three sets of adjustment holes to secure channel assembly 106 to base section 104. Thus, different adjustment holes 144 may be aligned with different adjustment holes 132 to position channel assembly 106 at different heights (e.g., relative to base section 104).

For example, as shown in the configuration of FIGS. 5 and 6, adjustment holes 144-1, 144-3, and 144-5 may be aligned with adjustment holes 132-1, 132-3, and 132-5, respectively, with fasteners 145 inserted therethrough, to secure channel assembly 106 in a lowest-height configuration for mounting pole 100 (e.g., 10 feet tall). As another example (not specifically shown), adjustment holes 144-1, 144-2, and 144-3 may be aligned with adjustment holes 132-7, 132-8, and 132-9, respectively, with fasteners 145 inserted therethrough, to secure channel assembly 106 in a highest-height configuration for mounting pole 100 (e.g., 16-feet tall). Other alignment-hole combinations may be used to achieve other height configurations for mounting pole 100 (e.g., 11-15 feet tall configurations). Although described herein in the context of 12-inch height increments, in other implementations mounting pole 100 may be configured to be adjusted in different height increments by using different hole spacing intervals for adjustment holes 132 and 144. For example, in another implementation, 6-inch hole spacing intervals may be used.

Power module mounting holes 146 may be positioned above adjustment holes 144 on channel assembly 106. Power module mounting holes 146 may be sized and positioned to receive threaded bolts to secure a mounting bracket 22 (FIG. 8) for power module 20. In one implementation, power module mounting holes 146 may use the same sized and position intervals as used for adjustment holes 144. In other implementations, power module mounting holes 146 may be sized differently and positioned at different intervals than adjustment holes 144.

Each power module mounting hole 146 may include a nut (not visible, but similar to nut 152 described below) that is welded to the inside surface of bar 140 and aligned with power module mounting hole 146 to receive mounting hardware. Thus, power module mounting holes 146 may receive a threaded bolt for securing bracket 22 without requiring access to a back side of bar 140. In another implementation, power module mounting holes 146 may be threaded to receive a threaded bolt for securing bracket 22 without use of a nut. While three power module mounting holes 146 are shown, different numbers of power module mounting holes 146 or combinations of power module mounting holes 146 may be used. For example, bracket 22 may be secured using a combination of any two of power module mounting holes 146.

Switch mounting holes 148 may be positioned above power module mounting holes 146 on channel assembly 106. Switch mounting holes 148 may be sized and positioned to receive threaded bolts to secure a bracket 12 (FIG. 8) for high voltage switch 10. In one implementation, switch mounting holes 148 may be sized differently and positioned at different intervals than adjustment holes 144 or power module mounting holes 146. For example, switch mounting holes 148 may be spaced to accommodate mounting brackets for particular models of high-voltage equipment.

Each switch mounting hole 148 may include a nut 152 (FIG. 6) that is welded to the inside surface of bar 140 and aligned with switch mounting hole 148 to receive mounting hardware. Thus, switch mounting holes 148 may receive a threaded bolt (not shown) for securing bracket 12 without requiring access to a back side of bar 140. In another implementation, each switch mounting hole 148 may include a spacer 154. Spacer 154 may include, for example, a rigid material, such as steel, welded to the front surface of bar 140 around switch mounting hole 148. In another implementation, spacer 154 may include a compressible and/or insulting material, such as rubber or ceramic.

Lifting eye 142 may be secured to bar 140 via a cap 150 included at an upper portion of the cavity created by the C-shaped cross section of bar 140, as shown in FIG. 6. Cap 150 may be secured, for example, via a weld along the interior C-shape of bar 140. Lifting eye 142 may be bolted, for example, through cap 150 to secure lifting eye 142 to bar 140. In one implementation, lifting eye 142 may generally be sized to support the weight of bar 140 sliding within front channel 120.

Figure 9:
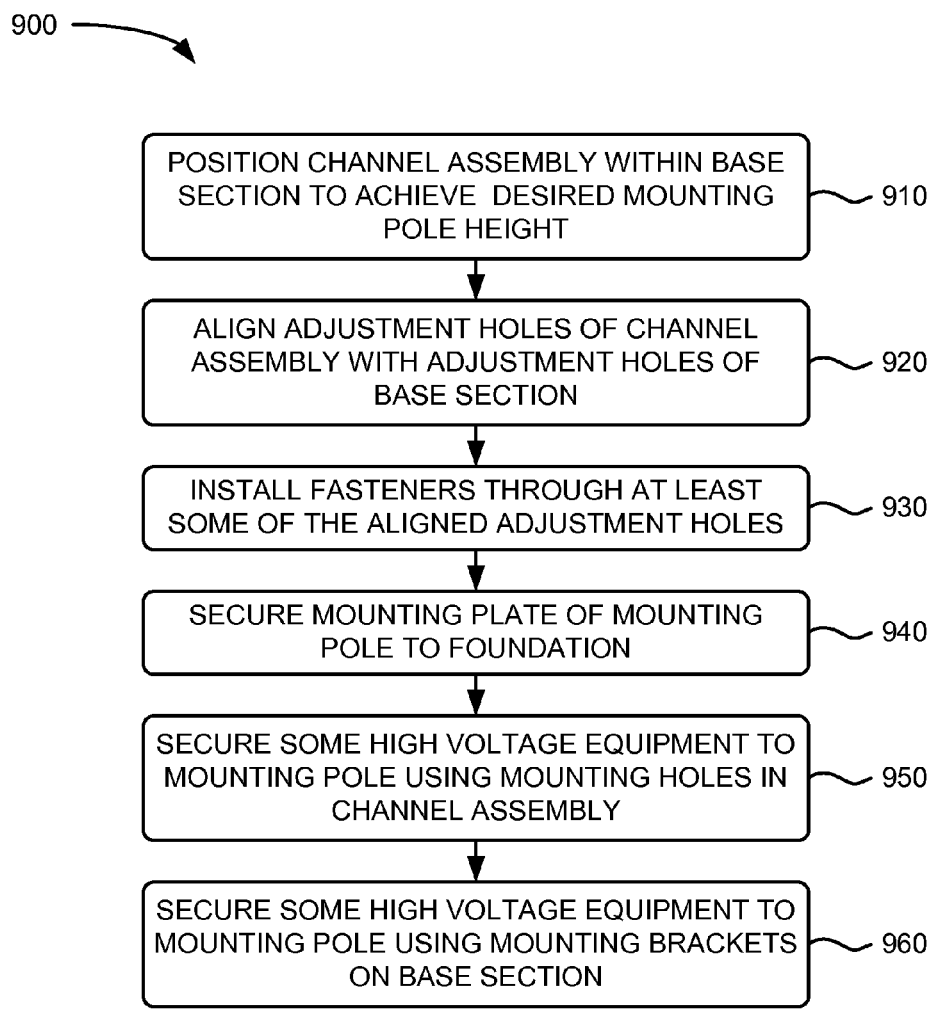
FIG. 9 is a flow diagram of a process for installing high voltage equipment on an adjustable mounting pole according to an implementation described herein.

FIG. 9 is a flow diagram of an exemplary process for installing high voltage equipment on an adjustable mounting pole according to an implementation described herein. Height adjustments and installations described herein may be performed as field operations at the equipment installation sight. As shown in FIG. 9, process 900 may include positioning a channel assembly within a base section to achieve a desired mounting pole height (block 910), aligning adjustment holes of the channel assembly with adjustment holes of the base section (block 920), and installing fasteners through at least some of the aligned adjustment holes (block 930). For example, given mounting pole 100, channel assembly 106 may be raised within channel 120 to a desired height (e.g., between 10 and 16 feet). Channel assembly 106 may be raised, for example, by use of a crane applying upward force to lifting eye 142, although other techniques may be used. Adjustment holes 132 may be aligned with adjustment holes 144, and fasteners 145 may be inserted through at least some of the overlapping holes 132/144.

Process 900 may also include securing a mounting plate of the mounting pole to a foundation (block 940). For example, with the desired height of mounting pole 100 set (e.g., channel assembly 106 is locked in place with respect to base section 104), mounting pole 100 may be positioned onto a foundation such that mounting plate 102 may be secured to the foundation via mounting holes 110. In one implementation, mounting pole 100 may be moved by using a crane coupled to lifting eye 142.

Process 900 may further include securing high voltage equipment to the mounting pole using mounting holes in channel assembly (block 950). For example, fasteners may be partially inserted into switch mounting holes 148. High voltage switch 10, equipped with mounting bracket 12, may be hung on the partially inserted fasteners, and the fasteners may then be tightened to secure high voltage switch in place. Additionally, if needed, power module 20, equipped with mounting bracket 22, may be fastened in place in a similar manner.

In addition, process 900 may include securing high voltage equipment to the mounting pole using mounting brackets on the base section (block 960). For example, control unit 30 may be hung on a preferred side of base section 106 using one of upper mounting brackets 124, one of lower mounting brackets 122, and appropriate hardware. Thus, it can be seen that control unit 30 may be mounted at a fixed height (e.g., on base section 104), regardless of the overall height selected for mounting pole 100.

The foregoing description of exemplary implementations provides illustration and description, but is not intended to be exhaustive or to limit the embodiments described herein to the precise form disclosed. Modifications and variations are possible in light of the above teachings or may be acquired from practice of the embodiments. For example, implementations described herein may also be used in conjunction with other devices, such as low, medium, or high voltage switchgear equipment, including 0-3 kV, 15 kV, 25 kV, 35 kV or higher equipment. For example, various features have been mainly described above with respect to high voltage switches in overhead switchgear environments. In other implementations, mounting pole 100 may be configured to support other low/medium/high voltage power components.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above-mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. A mounting pole for high voltage equipment, comprising:
   a base section including:
      a right-side flange, a left-side flange, and a center web formed substantially in the shape of an I-beam with a front channel, wherein the center web includes a first set of adjustment holes,
      multiple retaining brackets that span across the front channel from a front edge of the right-side flange to a front edge of the left-side flange, and
      a control mounting bracket secured to at least one of the right-side flange or the left-side flange to receive hardware for securing a control unit for a high voltage switch; and
   a channel assembly slideably contained within the front channel, wherein the channel assembly includes:
      a second set of adjustment holes, and
      a set of mounting holes, positioned above the second set of adjustment holes, to receive hardware for securing the high voltage switch,
   wherein the base section and the channel assembly are configured so that at least some of the first set of adjustment holes and some the second set of adjustment holes may be selectively aligned during field operations to set the mounting pole at one of multiple height increments.

2. The mounting pole of claim 1, further comprising a mounting plate secured to the bottom of the base section, wherein the mounting plate includes multiple apertures that are configured to receive hardware to secure the mounting pole to a platform.

3. The mounting pole of claim 2, wherein the base section and the mounting plate are further supported by a first set of extensions secured to the right-side flange and the mounting plate, and a second set of extensions secured to the left-side flange and the mounting plate.

4. The mounting pole of claim 1, wherein the channel assembly further includes a lifting eye exposed at a top end of the channel assembly, and wherein the lifting eye is configured to support the weight of the mounting pole while the mounting pole is set at any one of the multiple height increments.

5. The mounting pole of claim 1, wherein the channel assembly further includes another set of mounting holes, positioned above the second set of adjustment holes and below the set of mounting holes, to receive hardware for securing a power module for the high voltage switch.

6. The mounting pole of claim 1, wherein the first set of adjustment holes and the second set of adjustment holes are configured to receive hardware therethrough to maintain a selected alignment.

7. The mounting pole of claim 1, wherein the first set of adjustment holes and the second set of adjustment holes are configured to provide multiple 12-inch height increments for the mounting pole.

8. The mounting pole of claim 7, wherein the multiple 12-inch height increments include a 10-foot height and a 16-foot height.

9. The mounting pole of claim 1, wherein the channel assembly further includes a bar with a substantially C-shaped cross section.

10. A method for installing high voltage equipment on an adjustable mounting pole that includes a base section with mounting brackets and a channel assembly with mounting holes, comprising:
   positioning the channel assembly within the base section to achieve a desired mounting pole height, wherein the channel assembly includes a first set of adjustment holes and the base section includes a second set of adjustment holes;
   aligning some of the first set of adjustment holes of the channel assembly with some of the second set of adjustment holes of the base section;
   installing hardware through at least some of the aligned adjustment holes;
   securing a mounting plate of the mounting pole to a foundation;
   securing high voltage equipment to the mounting pole using at least some of the mounting holes in the channel assembly; and
   securing high voltage equipment to the mounting pole using the mounting brackets on the base section.

11. The method of claim 10, wherein the channel assembly further comprises a lifting eye exposed at a top end of the channel assembly, and wherein positioning the channel assembly within the base section to achieve the desired mounting pole height comprises:
   lifting the channel assembly via the lifting eye.

12. The method of claim 10, wherein securing high voltage equipment to the mounting pole using at least some of the mounting holes in the channel assembly comprises:
   inserting, though some of the mounting holes, hardware for securing a high voltage switch, and
   inserting, though some of the other mounting holes, hardware for securing a power module for the high voltage switch.

13. The method of claim 10, wherein positioning the channel assembly within the base section to achieve the desired mounting pole height comprises:
   aligning the channel assembly relative to the base section to achieve a mounting pole height of between 10 and 16 feet.

14. A system, comprising:
   a first mounting bracket configured to support a high voltage switch;
   a control unit; and
   a mounting pole that includes a base section and a channel section,
      wherein the base section includes a second mounting bracket configured to support the control unit,
      wherein the base section and the channel section are configured to be secured in different positions relative to each other to achieve different incremental heights of the mounting pole,
      wherein the channel section includes a first set of mounting holes configured to receive the first mounting bracket, and
      wherein second mounting bracket is configured to remain at a fixed height and the first set of mounting holes are configured to be selectively positioned to set the first mounting bracket at one of multiple incremental heights.

15. The system of claim 14, further comprising:
   a third mounting bracket configured to support a power module for the high voltage switch,
      wherein the channel section includes a second set of mounting holes configured to receive the third mounting bracket.

16. The system of claim 14, wherein the base section includes a right-side flange, a left-side flange, and a center web formed substantially in the shape of an I-beam with a front channel, wherein the center web includes a first set of adjustment holes, and
   wherein the channel assembly is slideably contained within the front channel.

17. The system of claim 16, wherein the base section further includes:
   multiple retaining brackets that span across the front channel from a front edge of the right-side flange to a front edge of the left-side flange.

18. The system of claim 17, wherein the mounting pole further comprises:
   a mounting plate secured to the bottom of the base section, wherein the mounting plate includes multiple apertures that are configured to receive hardware to secure the mounting pole to a platform.

19. The system of claim 18, wherein the mounting pole further comprises:
   a first set of extensions secured to the right-side flange and the mounting plate, and
   a second set of extensions secured to the left-side flange and the mounting plate.

20. The system of claim 14, wherein the channel assembly further includes a lifting eye exposed at a top end of the channel assembly, and wherein the lifting eye is configured to support a weight of the mounting pole.

* * * * *